(12) United States Patent
Visser et al.

(10) Patent No.: US 8,717,535 B2
(45) Date of Patent: May 6, 2014

(54) SLM CALIBRATION

(75) Inventors: Huibert Visser, Zevenhuizen (NL); Martinus Hendricus Hendricus Hoeks, Breugel (NL); Borgert Kruizinga, Zoetermeer (NL); Bob Streefkerk, Tilburg (NL); Patricius Aloysius Jacobus Tinnemans, Hapert (NL); Erwin John Van Zwet, Pijnacker (NL); Roeland Nicolaas Maria Vanneer, Eindhoven (NL); Marcus Gerhardus Hendrikus Meijerink, The Hague (NL); Nicolaas Cornelis Johannes Van Der Valk, Zoetermeer (NL); Har Van Himbergen, The Hague (NL)

(73) Assignee: ASML Netherlands B.V., Veldhoven (NL)

( * ) Notice: Subject to any disclaimer, the term of this patent is extended or adjusted under 35 U.S.C. 154(b) by 1511 days.

(21) Appl. No.: 12/341,081

(22) Filed: Dec. 22, 2008

(65) Prior Publication Data

US 2009/0244506 A1 Oct. 1, 2009

Related U.S. Application Data

(60) Provisional application No. 61/017,285, filed on Dec. 28, 2007.

(51) Int. Cl.
*G03B 27/42* (2006.01)
(52) U.S. Cl.
USPC .................................. 355/53; 355/30; 355/67
(58) Field of Classification Search
USPC .......................................... 355/53, 55, 63, 67
See application file for complete search history.

(56) References Cited

U.S. PATENT DOCUMENTS

| 7,110,159 | B2 | 9/2006 | Ljungblad |
| 7,197,828 | B2 | 4/2007 | Lof et al. |
| 7,864,293 | B2 | 1/2011 | Kato et al. |
| 2005/0157285 | A1* | 7/2005 | Schothorst et al. ............. 355/71 |
| 2006/0082752 | A1* | 4/2006 | Bleeker et al. ................... 355/69 |
| 2006/0098210 | A1* | 5/2006 | Freimann et al. ............. 356/521 |
| 2007/0273722 | A1 | 11/2007 | Sumi et al. |

FOREIGN PATENT DOCUMENTS

| JP | 2006-252256 A | 9/2006 |
| JP | 2006-337999 A | 12/2006 |
| JP | 2007-522671 A | 8/2007 |
| JP | 2007-316194 A | 12/2007 |
| WO | WO 2006/080285 A1 | 8/2006 |

OTHER PUBLICATIONS

English-Language Abstract for Japanese Patent Publication No. 2006-252256 A, published Sep. 21, 2006; 1 page.

* cited by examiner

*Primary Examiner* — Steven H Whitesell Gordon
*Assistant Examiner* — Mesfin T Asfaw
(74) *Attorney, Agent, or Firm* — Sterne, Kessler, Goldstein & Fox P.L.L.C.

(57) ABSTRACT

Apparatus and methods are used to calibrate an array of individually controllable elements within a lithographic apparatus. A calibration unit can switch between a first state in which the modulated beam of radiation passes into a projection system for projecting the modulated beam of radiation onto a substrate and a second state in which a portion of the modulated beam of radiation is inspected by the calibration unit. The calibration unit generates calibration data, or alternatively, updates calibration data, based on the inspection of the modulated beam of radiation. An array controller uses the calibration data to provide control signals to elements of an array of individually controllable elements, which are subsequently configured in response to the control signals.

44 Claims, 7 Drawing Sheets

SLM CALIBRATION

CROSS REFERENCE TO RELATED APPLICATIONS

This application claims benefit under 35 U.S.C. §119(e) to U.S. Provisional Patent Application No. 61/017,285, file Dec. 28, 2007, which is incorporated by reference herein in its entirety.

BACKGROUND

1. Field of the Invention

The present invention relates to a lithographic apparatus and a method for manufacturing a device.

2. Related Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, a patterning device, which can be referred to as a mask or a reticle, can be used to generate a circuit pattern corresponding to an individual layer of a flat panel display (or other device). This pattern can be transferred onto all or part of the substrate (e.g., a glass plate), by imaging onto a layer of radiation-sensitive material (e.g., resist) provided on the substrate.

Instead of a circuit pattern, the patterning device can be used to generate other patterns, for example a color filter pattern or a matrix of dots. Instead of a mask, the patterning device can be a patterning array that comprises an array of individually controllable elements. The pattern can be changed more quickly and for less cost in such a system compared to a mask-based system.

A flat panel display substrate is typically rectangular in shape. Lithographic apparatus designed to expose a substrate of this type can provide an exposure region that covers a full width of the rectangular substrate, or covers a portion of the width (for example half of the width). The substrate can be scanned underneath the exposure region, while the mask or reticle is synchronously scanned through a beam. In this way, the pattern is transferred to the substrate. If the exposure region covers the full width of the substrate then exposure can be completed with a single scan. If the exposure region covers, for example, half of the width of the substrate, then the substrate can be moved transversely after the first scan, and a further scan is typically performed to expose the remainder of the substrate.

In an apparatus using an array of individually controllable elements, the array may include a very large number of individually controllable elements, and each of the individually controllable elements may be very small. Accordingly, it is difficult to manufacture an array of individually controllable elements that is precisely as designed. For example, some of the individually controllable elements, which may, for example, be rotatable mirrors, may be partially deformed. In addition, the response of each individually controllable element to a control voltage that may be used to control the individually controllable element may vary from element to element. Accordingly, it has previously been known that it is necessary to determine the characteristics of each of the individually controllable elements within an array, for example to determine its reflectivity to the radiation to be used in the lithographic apparatus and to determine the response of each of the individually controllable elements to a control voltage in order to provide calibration data that enables the array of individually controllable elements to be provided with the control signals necessary to provide a desired pattern.

For example, it has previously been known to inspect each individually controllable element within an array of individually controllable elements, for example using an interferometer, in order to determine its properties and to repeat the inspection of each individually controllable element while providing it with a plurality of different control voltages in order to calibrate its response to the control voltages. However, inspecting each individually controllable element and determining its individual response to a control voltage is time-consuming. This is particularly disadvantageous because the response of the individually controllable elements to respective control voltages may vary during the lifetime of the array of individually controllable elements. Accordingly, the calibration process may need to be repeated. The time required for subsequent calibration may result in increased costs of ownership of the lithography apparatus because, during the calibration process, the lithographic apparatus cannot be used to manufacture devices on a substrate.

Furthermore, the additional components required to provide a device to inspect the array of individually controllable elements may increase the cost of the lithographic apparatus. Alternatively, if the device for inspecting the array of individually controllable elements is not part of the lithographic apparatus, the calibration process may include the removal of the array of individually controllable elements from the lithographic apparatus in order to inspect it. Such an arrangement further increases the delay caused by a calibration process, further increasing the cost of ownership of the lithographic apparatus.

SUMMARY

Therefore, what is needed is a system and method that facilitate the use of an array of individually controllable elements within a lithographic apparatus.

In an embodiment, there is provided a lithographic apparatus comprising an illumination system, an array of individually controllable elements, a projection system, and a calibration unit. The illumination system is configured to condition a beam of radiation. The array of individually controllable elements being is to modulate the beam of radiation. The projection system is configured to project the modulated beam of radiation onto a substrate. The calibration unit comprises a radiation beam inspection device, configured to inspect a portion of a beam of radiation passed into the calibration unit. The calibration unit is configured such that, in a first state, the modulated beam of radiation passes into the projection system and, in a second state, the modulated beam of radiation is passed into the calibration unit.

In an embodiment, there is provided a method of at least one of generating and updating calibration data for a lithographic apparatus comprising the following steps: (a) generating control signals to set each of the individually controllable elements of the array of individually controllable elements such that the modulated beam of radiation is nominally at minimum radiation intensity across its cross-section; (b) inspecting at least a portion of the modulated beam of radiation; (c) using the results of step (b) to at least one of generate and update calibration data to be used by the array controller when generating control signals for controlling the array of individually controllable elements; (d) re-setting the array of individually controllable elements to modulate the beam of radiation to have minimum radiation intensity across its cross-section; and (e) repeat steps (b), (c) and (d) until the variation of the radiation intensity from a given minimum value across the cross-section of the beam of radiation is below a predetermined threshold.

In an embodiment, there is provided a device manufacturing method comprising modulating a beam of radiation using an array of individually controllable elements and projecting the modulated beam of radiation onto a substrate. Control signals for the array of individually controllable elements are generated using calibration data as generated, for example, per the method above.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

Figure 8:
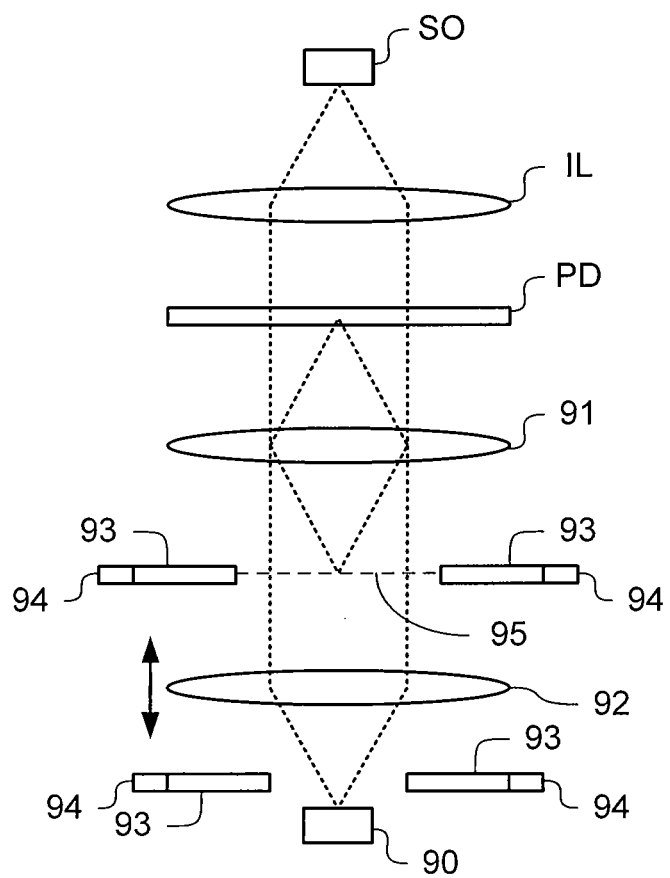

FIG. 8 schematically represents the arrangement of optical elements for projecting portions of a modulated beam of radiation onto a radiation beam inspection device.

Figure 9:
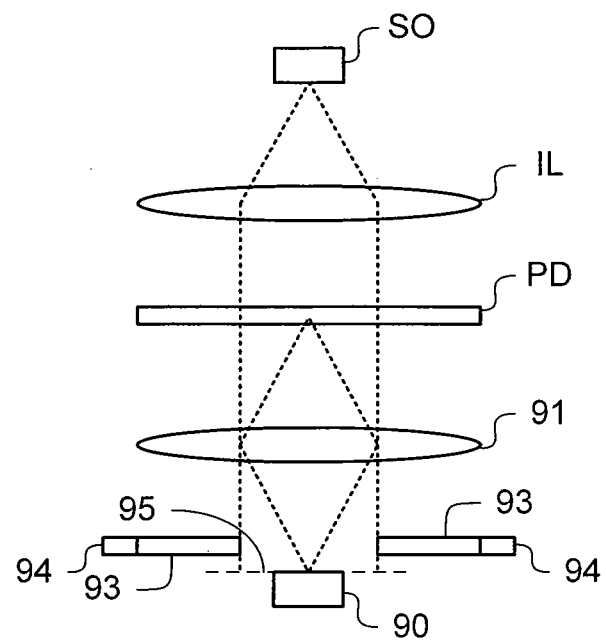

FIG. 9 schematically an alternative arrangement of optical elements for projecting a portion of a modulated beam of radiation onto a radiation beam inspection device.

Figure 10:
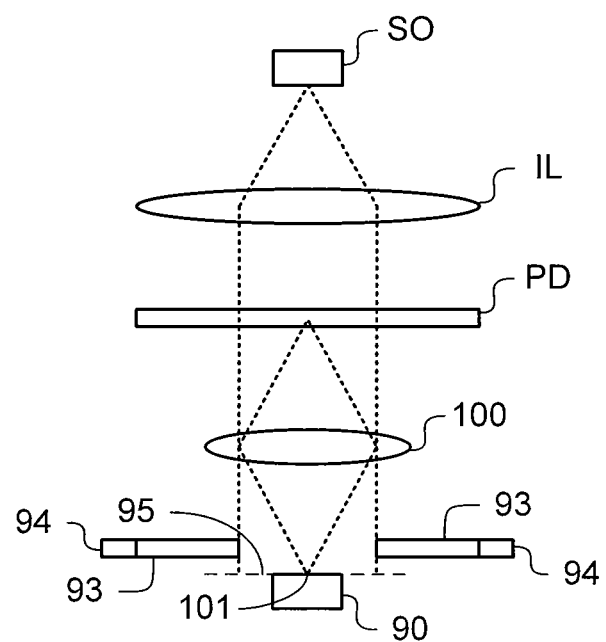

FIG. 10 depicts a further alternative arrangement of optical elements for projecting a portion of a modulated beam of radiation onto a radiation beam inspection device.

One or more embodiments of the present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described can include a particular feature, structure, or characteristic, but every embodiment cannot necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention can be implemented in hardware, firmware, software, or any combination thereof. Embodiments of the invention can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

Figure 1:
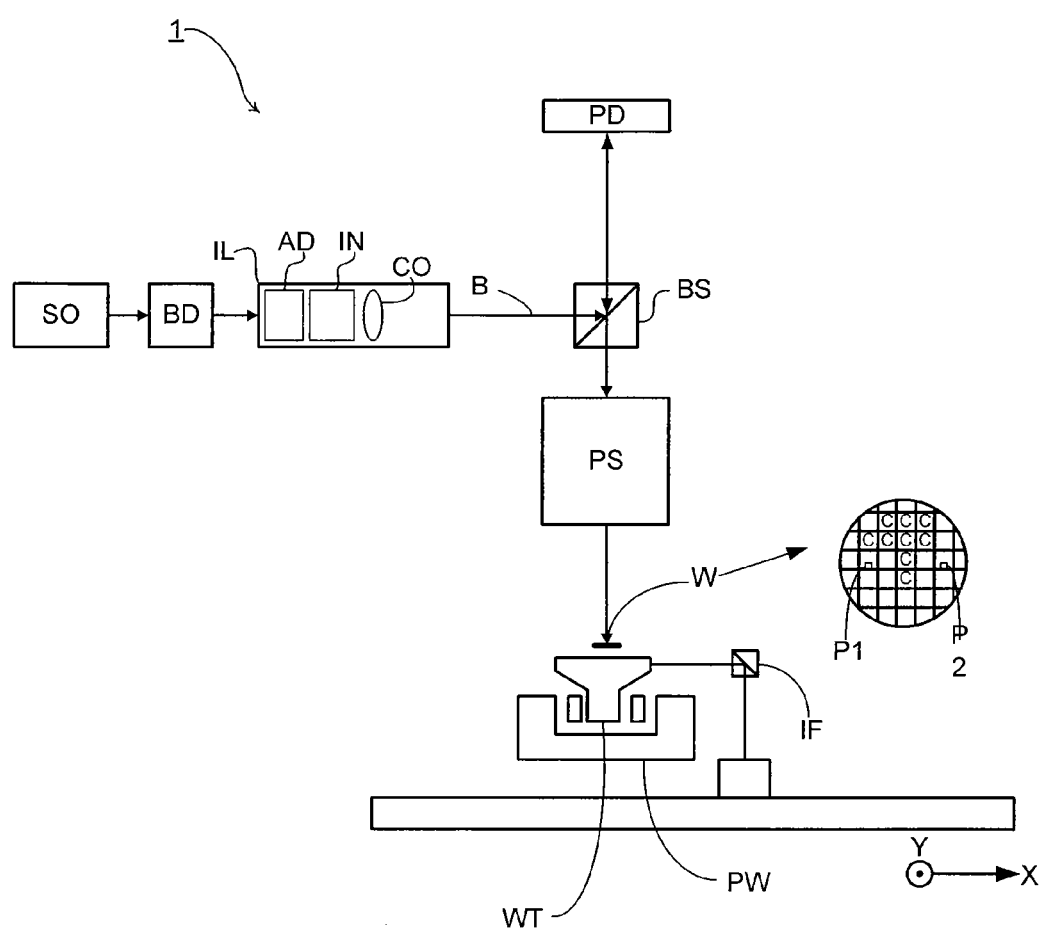
FIGS. 1 and 2 depict lithographic apparatus, according to various embodiments of the present invention.

FIG. 1 schematically depicts the lithographic apparatus 1 of one embodiment of the invention. The apparatus comprises an illumination system IL, a patterning device PD, a substrate table WT, and a projection system PS. The illumination system (illuminator) IL is configured to condition a radiation beam B (e.g., UV radiation).

It is to be appreciated that, although the description is directed to lithography, the patterned device PD can be formed in a display system (e.g., in a LCD television or projector), without departing from the scope of the present invention. Thus, the projected patterned beam can be projected onto many different types of objects, e.g., substrates, display devices, etc.

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the array of individually controllable elements onto a target portion C (e.g., comprising one or more dies) of the substrate W. The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The illumination system can include various types of optical components, such as refractive, reflective, magnetic, electromagnetic, electrostatic or other types of optical components, or any combination thereof, for directing, shaping, or controlling radiation.

The patterning device PD (e.g., a reticle or mask or an array of individually controllable elements) modulates the beam. In general, the position of the array of individually controllable elements will be fixed relative to the projection system PS. However, it can instead be connected to a positioner configured to accurately position the array of individually controllable elements in accordance with certain parameters.

The term "patterning device" or "contrast device" used herein should be broadly interpreted as referring to any device that can be used to modulate the cross-section of a radiation beam, such as to create a pattern in a target portion of the substrate. The devices can be either static patterning devices (e.g., masks or reticles) or dynamic (e.g., arrays of programmable elements) patterning devices. For brevity, most of the description will be in terms of a dynamic patterning device, however it is to be appreciated that a static pattern device can also be used without departing from the scope of the present invention.

It should be noted that the pattern imparted to the radiation beam cannot exactly correspond to the desired pattern in the target portion of the substrate, for example if the pattern includes phase-shifting features or so called assist features. Similarly, the pattern eventually generated on the substrate cannot correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include reticles, programmable mirror arrays, laser diode arrays, light emitting diode arrays, grating light valves, and LCD arrays.

Patterning devices whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." The patterning device comprises at least 10, at least 100, at least 1,000, at least 10,000, at least 100,000, at least 1,000,000, or at least 10,000,000 programmable elements.

A programmable mirror array can comprise a matrix-addressable surface having a viscoelastic control layer and a reflective surface. The basic principle behind such an apparatus is that addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (micro-electro-mechanical system devices) can also be used in a corresponding manner. In one example, a diffractive optical MEMS device is composed of a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction than unaddressed mirrors; in this manner, the reflected beam can be patterned according to the addressing pattern of the matrix-addressable mirrors. The required matrix addressing can be performed using suitable electronic means.

Another example PD is a programmable LCD array.

The lithographic apparatus can comprise one or more contrast devices. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

In one example, such as the embodiment depicted in FIG. 1, the substrate W has a substantially circular shape, optionally with a notch and/or a flattened edge along part of its perimeter. In another example, the substrate has a polygonal shape, e.g., a rectangular shape.

Examples where the substrate has a substantially circular shape include examples where the substrate has a diameter of at least 25 mm, at least 50 mm, at least 75 mm, at least 100 mm, at least 125 mm, at least 150 mm, at least 175 mm, at least 200 mm, at least 250 mm, or at least 300 mm. Alternatively, the substrate has a diameter of at most 500 mm, at most 400 mm, at most 350 mm, at most 300 mm, at most 250 mm, at most 200 mm, at most 150 mm, at most 100 mm, or at most 75 mm.

Examples where the substrate is polygonal, e.g., rectangular, include examples where at least one side, at least 2 sides or at least 3 sides, of the substrate has a length of at least 5 cm, at least 25 cm, at least 50 cm, at least 100 cm, at least 150 cm, at least 200 cm, or at least 250 cm.

At least one side of the substrate has a length of at most 1000 cm, at most 750 cm, at most 500 cm, at most 350 cm, at most 250 cm, at most 150 cm, or at most 75 cm.

In one example, the substrate W is a wafer, for instance a semiconductor wafer. The wafer material can be selected from the group consisting of Si, SiGe, SiGeC, SiC, Ge, GaAs, InP, and InAs. The wafer can be: a III/V compound semiconductor wafer, a silicon wafer, a ceramic substrate, a glass substrate, or a plastic substrate. The substrate can be transparent (for the naked human eye), colored, or absent a color.

The thickness of the substrate can vary and, to an extent, can depend on the substrate material and/or the substrate dimensions. The thickness can be at least 50 μm, at least 100 μm, at least 200 μm, at least 300 μm, at least 400 μm, at least 500 μm, or at least 600 μm. Alternatively, the thickness of the substrate can be at most 5000 μm, at most 3500 μm, at most 2500 μm, at most 1750 μm, at most 1250 μm, at most 1000 μm, at most 800 μm, at most 600 μm, at most 500 μm, at most 400 μm, or at most 300 μm.

The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements such as a micro lens array (known as an MLA) or a Fresnel lens array to form the secondary sources and to image spots onto the substrate. The array of focusing elements (e.g., MLA) comprises at least 10 focus elements, at least 100 focus elements, at least 1,000 focus elements, at least 10,000 focus elements, at least 100,000 focus elements, or at least 1,000,000 focus elements.

The number of individually controllable elements in the patterning device is equal to or greater than the number of focusing elements in the array of focusing elements. One or more (e.g., 1,000 or more, the majority, or each) of the focusing elements in the array of focusing elements can be optically associated with one or more of the individually controllable elements in the array of individually controllable elements, with 2 or more, 3 or more, 5 or more, 10 or more, 20 or more, 25 or more, 35 or more, or 50 or more of the individually controllable elements in the array of individually controllable elements.

The MLA can be movable (e.g., with the use of one or more actuators) at least in the direction to and away from the substrate. Being able to move the MLA to and away from the substrate allows, e.g., for focus adjustment without having to move the substrate.

Figure 2:
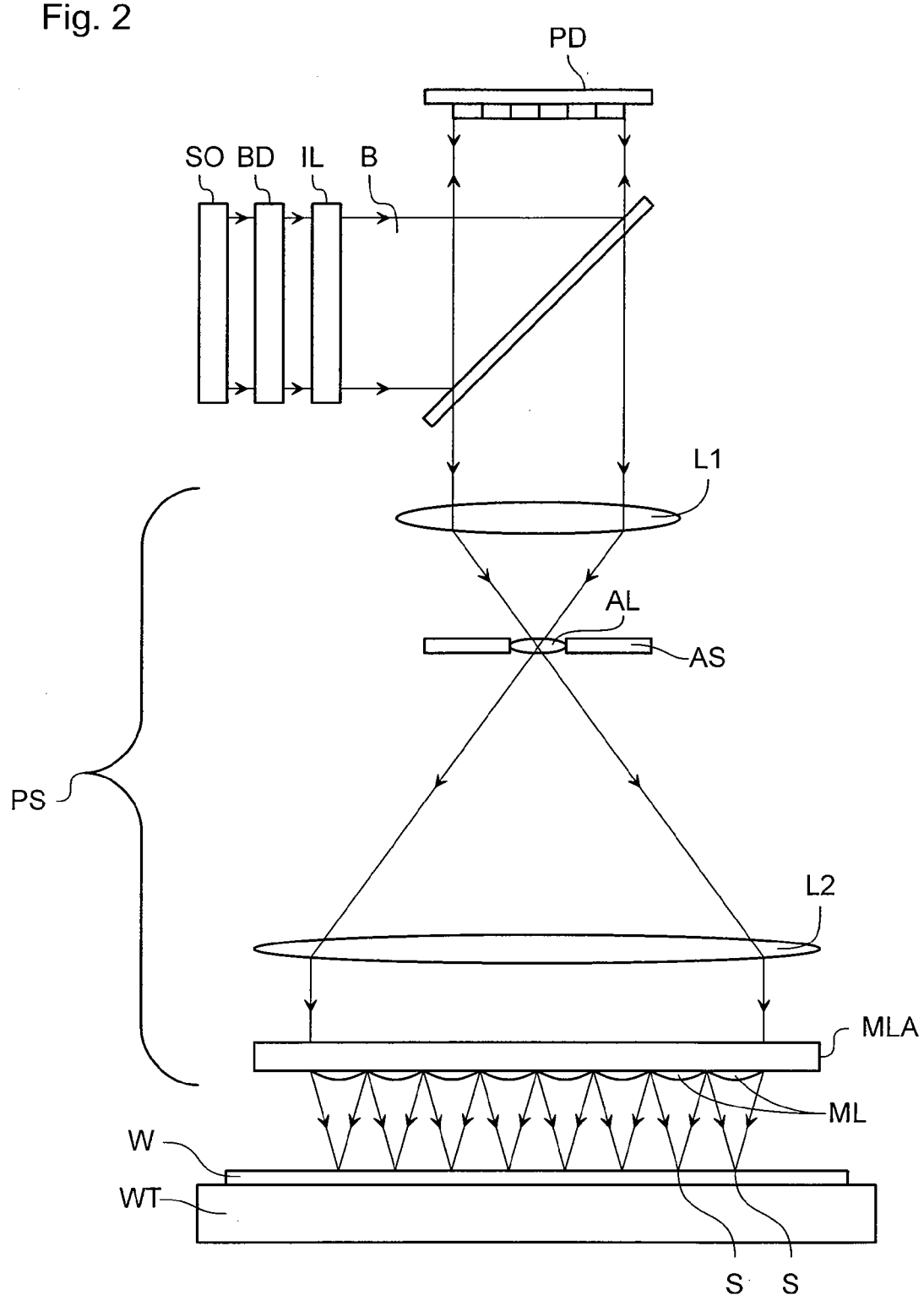

As herein depicted in FIGS. 1 and 2, the apparatus is of a reflective type (e.g., employing a reflective array of individually controllable elements). Alternatively, the apparatus can be of a transmission type (e.g., employing a transmission array of individually controllable elements).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. The radiation source provides radiation having a wavelength of at least 5 nm, at least 10 nm, at least 11-13 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. Alternatively, the radiation provided by radiation source SO has a wavelength of at most 450 nm, at most 425 nm, at most 375 nm, at most 360 nm, at most 325 nm, at most 275 nm, at most 250 nm, at most 225 nm, at most 200 nm, or at most 175 nm. The radiation can have a wavelength including 436 nm, 405 nm, 365 nm, 355 nm, 248 nm, 193 nm, 157 nm, and/or 126 nm.

The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as a-outer and i-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable elements of the array of individually controllable elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF2 (e.g., an interferometric device, linear encoder, capacitive sensor, or the like), the substrate table WT can be moved accurately, e.g., so as to position different target portions C in the path of the radiation beam B. Where used, the positioning means for the array of individually controllable elements can be used to correct accurately the position of the patterning device PD with respect to the path of the beam B, e.g., during a scan.

In one example, movement of the substrate table WT is realized with the aid of a long-stroke module (course positioning) and a short-stroke module (fine positioning), which are not explicitly depicted in FIG. 1. In another example, a short stroke stage cannot be present. A similar system can also be used to position the array of individually controllable elements. It will be appreciated that the beam B can alternatively/additionally be moveable, while the object table and/or the array of individually controllable elements can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system for scanning the substrate W across it at a substantially constant velocity.

As shown in FIG. 1, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. The beam of radiation can be directed at the patterning device at an angle between 0 and 90°, between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 1 cannot be required if a transmission patterning device is used.

The depicted apparatus can be used in several modes:

1. In step mode, the array of individually controllable elements and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements can be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the beam B is caused to scan a line across the substrate W. The pattern on the array of individually controllable elements is updated as required between pulses of the radiation system and the pulses are timed such that successive target portions C are exposed at the required locations on the substrate W. Consequently, the beam B can scan across the substrate W to expose the complete pattern for a strip of the substrate. The process is repeated until the complete substrate W has been exposed line by line.

4. Continuous scan mode is essentially the same as pulse mode except that the substrate W is scanned relative to the modulated beam of radiation B at a substantially constant speed and the pattern on the array of individually controllable elements is updated as the beam B scans across the substrate W and exposes it. A substantially constant radiation source or a pulsed radiation source, synchronized to the updating of the pattern on the array of individually controllable elements, can be used.

5. In pixel grid imaging mode, which can be performed using the lithographic apparatus of FIG. 2, the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern can be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, the radiation dose at the edges of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary. These can be not only to maximum or minimum intensity levels, but also to intensity levels between the maximum and minimum intensity levels. This is commonly referred to as "grayscaling."

Grayscaling provides greater control of the position of the pattern feature boundaries than is possible in a lithography system in which the radiation intensity provided to the substrate by a given individually controllable element can only be set to two values (e.g., just a maximum value and a minimum value). At least 3, at least 4 radiation intensity values, at least 8 radiation intensity values, at least 16 radiation intensity values, at least 32 radiation intensity values, at least 64 radiation intensity values, at least 128 radiation intensity values, or at least 256 different radiation intensity values can be projected onto the substrate.

It should be appreciated that grayscaling can be used for additional or alternative purposes to that described above. For example, the processing of the substrate after the exposure can be tuned, such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling can be used to provide a radiation dose profile across the substrate having more than two desired dose levels. The radiation dose profile can have at least 2 desired dose levels, at least 3 desired radiation dose levels, at least 4 desired radiation dose levels, at least 6 desired radiation dose levels or at least 8 desired radiation dose levels.

It should further be appreciated that the radiation dose profile can be controlled by methods other than by merely controlling the intensity of the radiation received at each point on the substrate, as described above. For example, the radiation dose received by each point on the substrate can alternatively or additionally be controlled by controlling the duration of the exposure of the point. As a further example, each point on the substrate can potentially receive radiation in a plurality of successive exposures. The radiation dose received by each point can, therefore, be alternatively or additionally controlled by exposing the point using a selected subset of the plurality of successive exposures.

FIG. 2 depicts an arrangement of the apparatus according to the present invention that can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

As shown in FIG. 2, the projection system PS includes a beam expander, which comprises two lenses L1, L2. The first lens L1 is arranged to receive the modulated radiation beam B and focus it through an aperture in an aperture stop AS. A further lens AL can be located in the aperture. The radiation beam B then diverges and is focused by the second lens L2 (e.g., a field lens).

The projection system PS further comprises an array of lenses MLA arranged to receive the expanded modulated radiation B. Different portions of the modulated radiation beam B, corresponding to one or more of the individually controllable elements in the patterning device PD, pass through respective different lenses ML in the array of lenses MLA. Each lens focuses the respective portion of the modulated radiation beam B to a point which lies on the substrate W. In this way an array of radiation spots S is exposed onto the substrate W. It will be appreciated that, although only eight lenses of the illustrated array of lenses 14 are shown, the array of lenses can comprise many thousands of lenses (the same is true of the array of individually controllable elements used as the patterning device PD).

Figure 3:
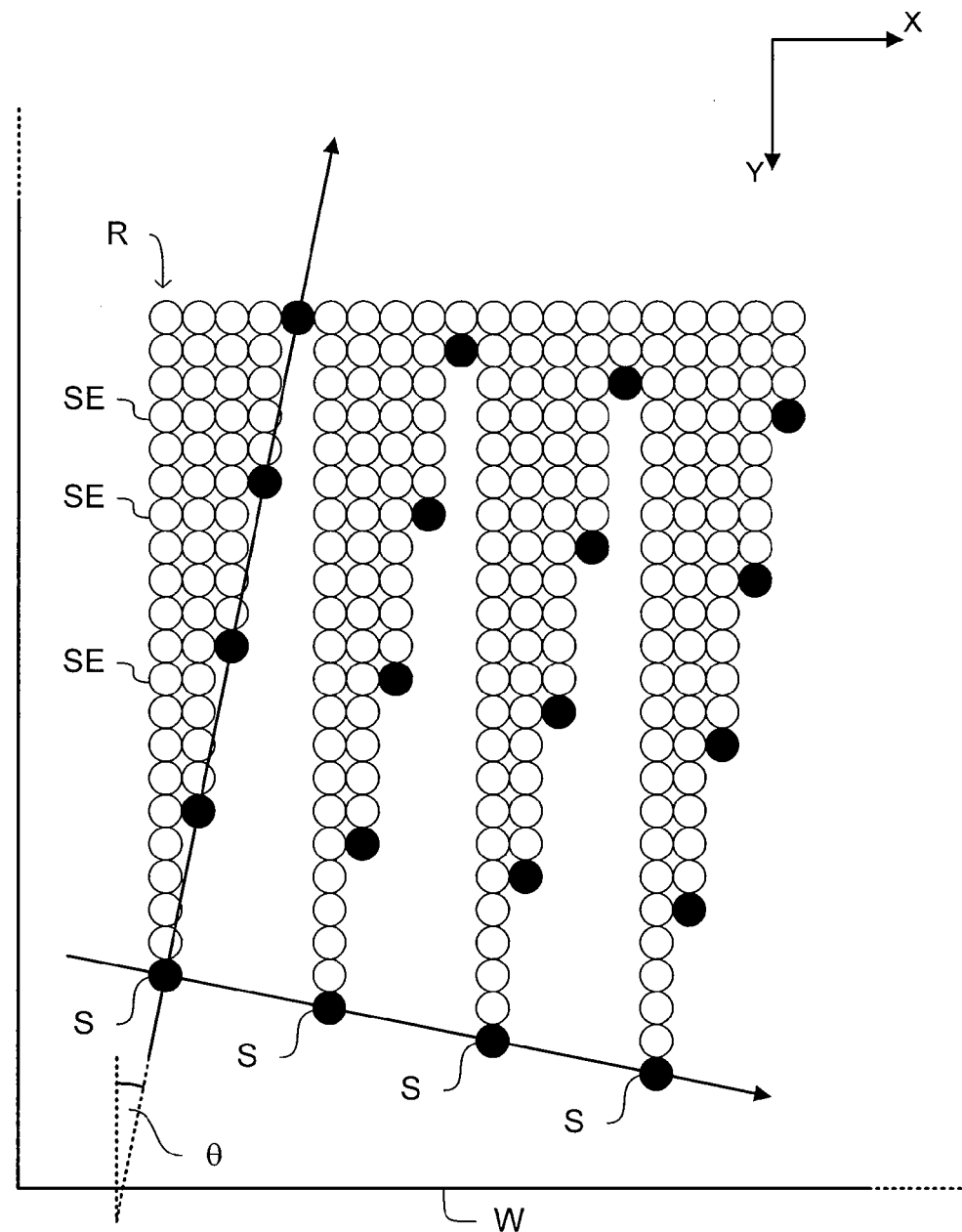
FIG. 3 depicts a mode of transferring a pattern to a substrate according to one embodiment of the invention as shown in FIG. 2.

FIG. 3 illustrates schematically how a pattern on a substrate W is generated using the system of FIG. 2, according to one embodiment of the present invention. The filled in circles represent the array of spots S projected onto the substrate W by the array of lenses MLA in the projection system PS. The substrate W is moved relative to the projection system PS in the Y direction as a series of exposures are exposed on the substrate W. The open circles represent spot exposures SE that have previously been exposed on the substrate W. As shown, each spot projected onto the substrate by the array of lenses within the projection system PS exposes a row R of spot exposures on the substrate W. The complete pattern for the substrate is generated by the sum of all the rows R of spot exposures SE exposed by each of the spots S. Such an arrangement is commonly referred to as "pixel grid imaging," discussed above.

It can be seen that the array of radiation spots S is arranged at an angle θ relative to the substrate W (the edges of the substrate lie parallel to the X and Y directions). This is done so that when the substrate is moved in the scanning direction (the Y-direction), each radiation spot will pass over a different area of the substrate, thereby allowing the entire substrate to be covered by the array of radiation spots 15. The angle θ can be at most 20°, at most 10°, at most 5°, at most 3°, at most 10, at most 0.5°, at most 0.25°, at most 0.10°, at most 0.05°, or at most 0.01°. Alternatively, the angle θ is at least 0.0010.

Figure 4:
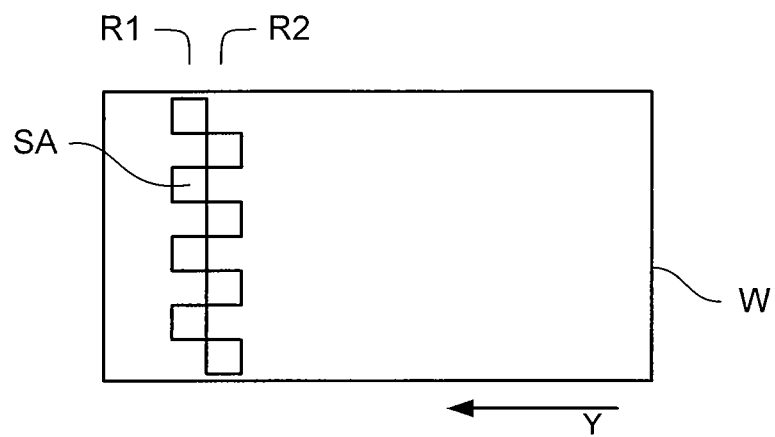
FIG. 4 depicts an arrangement of optical engines, according to one embodiment of the present invention.

FIG. 4 shows schematically how an entire flat panel display substrate W can be exposed in a single scan using a plurality of optical engines, according to one embodiment of the present invention. In the example shown eight arrays SA of radiation spots S are produced by eight optical engines (not shown), arranged in two rows R1, R2 in a "chess board" configuration, such that the edge of one array of radiation spots (e.g., spots S in FIG. 3) slightly overlaps (in the scanning direction Y) with the edge of the adjacent array of radiation spots. In one example, the optical engines are arranged in at least 3 rows, for instance 4 rows or 5 rows. In this way, a band of radiation extends across the width of the substrate W, allowing exposure of the entire substrate to be performed in a single scan. It will be appreciated that any suitable number of optical engines can be used. In one example, the number of optical engines is at least 1, at least 2, at least 4, at least 8, at least 10, at least 12, at least 14, or at least 17. Alternatively, the number of optical engines is less than 40, less than 30 or less than 20.

Each optical engine can comprise a separate illumination system IL, patterning device PD and projection system PS as described above. It is to be appreciated, however, that two or more optical engines can share at least a part of one or more of the illumination system, patterning device and projection system.

Figure 5:
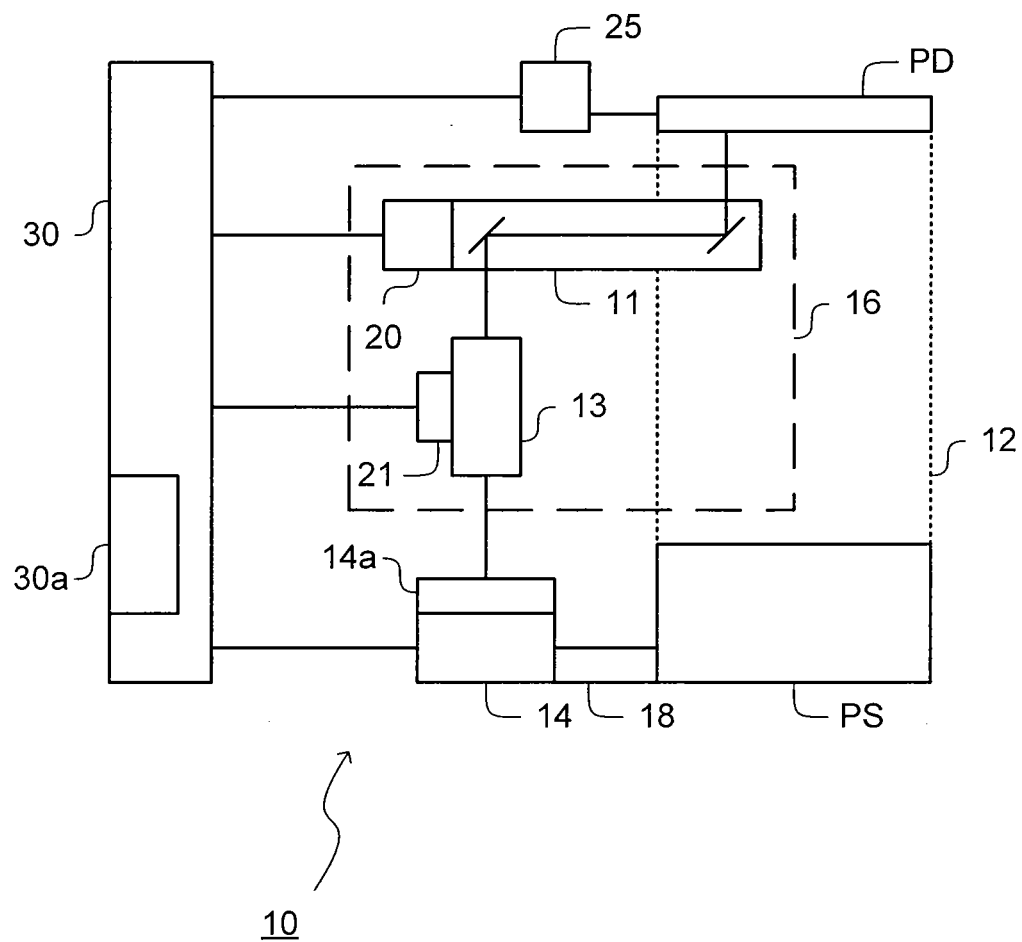
FIG. 5 depicts an arrangement of a calibration unit for a lithography apparatus.

FIG. 5 depicts a calibration unit 10 that may be used according to the present invention. As shown, the calibration unit 10 may include a set of optical components 11 (hereafter referred to as "selection optics"), provided to select a portion of the beam of radiation 12 modulated by the array of individually controllable elements PD. In particular, the selection optics 11 may be arranged between the array of individually controllable elements PD and the entrance to the projection system PS. A second set of optical components 13 is provided to direct the portion of the modulated beam of radiation onto a radiation beam inspection device 14. The radiation beam inspection device 14 may be any convenient arrangement and may, for example, be a camera a CCD, a CMOS sensor, a single point photo diode or a group of these. A scintillator layer 14 a may be provided on the surface of the radiation beam inspection device 14. Such a layer 14 a may be used to improve the efficiency of the radiation beam inspection device and/or convert the wavelength of the radiation from the wavelength used in the lithography apparatus to a wavelength at which the radiation beam inspection device 14 is sensitive. However, depending on the nature of the radiation beam inspection device and the wavelength of the radiation used a scintillator layer may not be required.

Accordingly, an arrangement such as that depicted in FIG. 5 permits the inspection of a beam of radiation modulated by the array of individually controllable elements PD. Accordingly, it is possible, as explained below, to determine the characteristics of the array of individually controllable elements and its response to control signals. It should be noted, however, that it may be sufficient merely to determine the effect on an aerial image of control signals provided to the array without fully determining all characteristics of each individually controllable element.

It will be appreciated that it is not necessary to remove the array of individually controllable elements PD from the lithography apparatus. Furthermore, in such an arrangement, the array of individually controllable elements PD is illuminated using radiation provided by the same illumination system IL that is used when the array of individually controllable elements PD is used to modulate beams of radiation that are projected onto a substrate in order to form devices. This may be beneficial because, as with an exposure process, during a calibration process, it may be important that the radiation intensity is relatively high. This may enable the use of shorter periods of time to obtain an accurate measurement using the radiation beam inspection device and, accordingly, may reduced the overall calibration time. Furthermore, there is no requirement to provide additional components in order to illuminate the array of individually controllable elements PD for performing calibration processes, reducing the cost of providing the calibration facility. Likewise, it is ensured that the illumination conditions of the array of individually controllable elements PD are the same during the calibration process as during an exposure process and, for example, that the wavelength of the radiation is the same.

As shown, the selection optics 11 may be provided with an actuator system 20 for controlling the position of one or more of the optical elements within the selection optics 11. Accordingly, the selection optics 11 may be moved in order to select the portion of the modulated beam of radiation that is inspected by the radiation beam inspection device 14. It should be appreciated that, although as depicted in FIG. 5, the selection optics 11 may comprise one or more simple reflectors to divert a portion of the modulated beam of radiation away from the projection system PS, alternative configurations may also be used.

As depicted in FIG. 5, a set of optics 13 may be used to direct the portion of the modulated beam of radiation 12 onto the radiation beam inspection device 14. The one or more optical components within the optical element set 13 may, for example, be adjustable using an appropriate actuator system 21 in order to appropriately focus the portion of the modulator beam of radiation 12 onto the radiation beam inspection device 14.

It should be appreciated that the selection optics 11 and the optical element set 13 used to direct the portion of the modulated beam of radiation onto the radiation beam inspection device 14 may together form a projection unit 16 that functions to select a portion of the modulated beam of radiation 12 to be inspected and to project it onto the radiation beam inspection device 14. It will be appreciated that other configurations are possible. In particular, one or more optical components in the projection unit may perform multiple functions. Alternatively, for example, the projection unit 16 may project the entirety of the modulated beam of radiation 12 onto an image plane and the radiation beam inspection device 14 itself may be moveable in order to select the portion of the modulated beam of radiation to be inspected. It should further be appreciated that the radiation beam inspection device may be configured to inspect substantially all of the beam of radiation modulated by the array of individually controllable elements.

However, as depicted in FIG. 5, the position of the radiation beam inspection device 14 may be substantially fixed relative to the position of the projection system PS. For example, as depicted in FIG. 5, both the projection system PS and the radiation beam inspection device 14 may be mounted to a common reference frame 18. Alternatively or additionally, the position of the radiation beam inspection device may be substantially fixed relative to the array of individually controllable elements for example by mounting the radiation beam inspection device and the array of individually controllable elements to a common reference frame.

It should be appreciated however, that one or both of the projection system PS and the radiation beam inspection device 14 may be mounted to the reference frame 18 by low stiffness supports in order to ensure that vibrations are not passed between the projection system PS or radiation beam inspection device 14 and the reference frame 18.

A position and/or displacement measurement system may be provided in order to monitor the position of the projection system PS and/or the radiation beam inspection device 14 relative to the reference frame or relative to each other.

Beneficially, by arranging the radiation beam inspection device 14 to be substantially fixed with the lithographic apparatus, it may be easier to provide the data connection between the radiation beam inspection device 14 and a control system, such as a calibration controller 30 provided to control the calibration unit 10. This may be important because, in order to minimize the time required for a calibration process, the data rate required to be output from the radiation beam inspection device 14 may be relatively large. Likewise, the power consumption within the radiation beam inspection device 14 may be relatively large. It is desirable to avoid unwanted thermal loads within the lithographic apparatus. Such heat loads may, for example, result in a heat load on the frame to which the radiation beam inspection device is mounted, resulting in a misalignment and reducing the accuracy of the measurements. Accordingly, it may be necessary to provide cooling to the radiation beam inspection device 14. Furthermore, cooling the temperature of the radiation beam inspection device may reduce the noise in measurements that it takes. Provision of cooling to the array of individually controllable elements may be facilitated by arranging the radiation beam inspection device 14 such that it is substantially fixed.

It will be appreciated that some of the optical elements of the projection unit 16 may also be fixed relative to the position of the radiation beam inspection device 14. However, some optical elements of the projection unit 16, such as those used to select the portion of the modulated beam of radiation 12 to be inspected by the radiation beam inspection device 14 may be moveable as discussed above.

Regardless of the configuration of the calibration unit, it will be appreciated that the calibration unit is arranged to switch between two states. In a first state the modulated beam of radiation 12 passes into the projection system PS without hindrance by the calibration unit 10. In a second state, at least a portion of the modulated beam of radiation 12 passes into the calibration unit 10 for inspection by the radiation beam inspection device 14. For example, in the arrangement depicted in FIG. 5, the selection optics 11 are moveable by the actuator system 20, not only to select the portion of the modulated beam of radiation 12 to be projected onto the radiation beam inspection device 14, namely operating the calibration unit 10 in the second state, but may also move the selection optics 11 such that no part interferes with the passing of the modulated beam of radiation 12 from the array of individually controllable elements PD to the projection system PS. Accordingly, when the calibration unit 10 is in a first state, the lithographic apparatus may perform an exposure process, modulating beams of radiation and exposing them on substrates in order to form devices, and, in the second state, the lithographic apparatus may perform a calibration process using the calibration unit 10. Accordingly, it is simple to switch the lithographic apparatus between an exposure process and a calibration process, reducing the time required to do so. This increases the availability of the lithographic apparatus to perform exposure processes, correspondingly reducing the cost of operation of the lithography apparatus.

As depicted in FIG. 5, the lithographic apparatus may include an array controller 25, configured to provide control signals to the array of individually controllable elements PD in order to set each of the individually controllable elements to a required state, namely in order to arrange the array of individually controllable elements in order to modulate a desired pattern to the beam of radiation. In order to generate the control signals, the array controller 25 may be configured to use calibration data in order to convert data corresponding to a required pattern into the control signals that may be provided to the array of individually controllable elements PD in order to provide the required pattern. It will therefore be appreciated that, during a calibration process, the calibration unit 10 may generate calibration data to be used by the array controller 25 during an exposure process. Alternatively or additionally, during a calibration process, the calibration unit 10 may update pre-existing calibration data for use in subsequent exposure processes.

In order to generate the calibration data, during a calibration process, a calibration controller 30 may instruct the array controller 25 to provide one or more sets of control signals to the array of individually controllable elements PD. The calibration controller 30 receives from the radiation beam inspection device 14 inspection data relating to the inspected portion of the modulated beam of radiation 12 corresponding to the control signals provided by the array controller 25 to the array of individually controllable elements PD. The calibration controller 30 may control the actuator 20 associated with the selection optics 11 in order to select a portion of the modulated beam of radiation 12 inspected by the radiation beam inspection device 14 during each part of the calibration process. The calibration controller 30 may control the set of optical elements 13 used to direct the portion of the modulated beam of radiation directed onto the radiation beam inspection device 14, for example, in order to control the focus of the portion of the modulated beam of radiation projected onto the radiation beam inspection device 14. Possible calibration processes are discussed further below.

The numerical aperture NA of the optical system of the projection unit 16 used to project a portion of the modulated beam of radiation 12 onto the radiation beam inspection device 14 may be selected such that it is below the level required for the radiation beam inspection device to resolve each of the individually controllable elements within the array PD using radiation of the wavelength of the modulated beam of radiation 12. Beneficially, therefore, less expensive optical elements may be used to form the projection unit 16 than is required in systems that resolve each element. In addition, the portion of the modulated beam of radiation inspected by the radiation beam inspection device 14 at any one instant is larger than it would be if the numeral aperture NA of the projection unit 16 were larger. A further benefit of the use of a relatively low numeral aperture NA of the projection unit 16 is that less of the radiation that is diffracted by the array of individually controllable elements PD will be imaged onto the radiation beam inspection device 14. Although the numerical aperture NA of the projection unit 16 may be relatively low, it should be appreciated that it may be desirable for the numerical aperture NA to be at least as high as the numerical aperture NA of the projection system PS used to project the modulated beam of radiation onto the substrate. Such an arrangement may ensure that the radiation beam inspection device receives all of the information transmitted by the projection system PS onto the substrate.

It will be appreciated that, using such a relatively low numerical aperture NA for the projection unit 16, one may not be able to determine specific characteristics of an individually controllable element from a single inspection. However, by combining data from a plurality of inspections, it may be possible to calibrate the overall response of the array of individually controllable elements PD when provided with a particular combination of control signals.

The determination of the characteristics of a single individually controllable element when provided with a particular control signal may, in particular, not be required because the lithographic apparatus may be arranged such that radiation received at a particular point on a substrate during an exposure process is derived from more than one of the individually controllable elements within the array. Such a configuration of the lithography apparatus may be used in order to reduce the impact of so-called dead pixels, namely individually controllable elements within the array that are defective, for example do not change state regardless of the control signal provided to them or do not respond to a control signal in a predictable or sufficiently predictable manner. As will be appreciated, where the radiation received at each point on the substrate is the sum of the radiation received from a plurality of individually controllable elements, the control signal provided to other individually controllable elements may be adjusted in order to compensate for the defective individually controllable element. Accordingly, as explained above, it may be more beneficial to calibrate the overall response of the array of individually controllable elements to the control signals provided to it rather than each of the individually controllable elements themselves.

It will be appreciated that the illumination system IL used to condition the beam of radiation to be modulated by the array of individually controllable elements PD may be operable in more than one setting. For example, the illumination system IL may be configured to be switchable between first and second states, in which the beam of radiation projected onto the substrate during an exposure process is linearly polarized in mutually orthogonal directions in the first and second states, respectively. Accordingly, different features may be exposed on the substrate using radiation of an appropriate polarization orientation. The calibration unit 10 may be configured such that it can generate and/or update calibration data independently for each setting of the illumination system IL. For example, during a calibration process, the illumination system IL may be set to a first setting and the calibration unit 10 may generate and/or update calibration data corresponding to that setting. Subsequently, the illumination system IL may be set to a second setting and the calibration unit 10 may perform a second calibration process in order to generate and/or update calibration data corresponding to the second setting. This process may be repeated as necessary for any or all of the illumination settings of the illumination system IL.

FIG. 5 depicts an exemplary calibration unit 10 that may be used in conjunction with a lithographic apparatus having a single array of individually controllable elements. In general, the size of an array of individually controllable elements is limited by the difficulty of manufacturing arrays of individually controllable elements with sufficiently few defective individually controllable elements. Accordingly, the area on a substrate that may be exposed using a beam of radiation modulated by a single array of individually controllable elements is limited. Therefore, in order to ensure an adequate rate of exposure of a substrate, the lithographic apparatus may utilize a plurality of arrays of individually controllable elements in order to modulate a beam of radiation to be exposed on the substrate. Each array of individually controllable elements may modulate a section of the cross-section of the beam of radiation. It will be appreciated that separate projection systems may be provided for projecting each such section onto the substrate. Alternatively, a single projection system may project all of the modulated sections of the beam of radiation onto the substrate.

Figure 6:
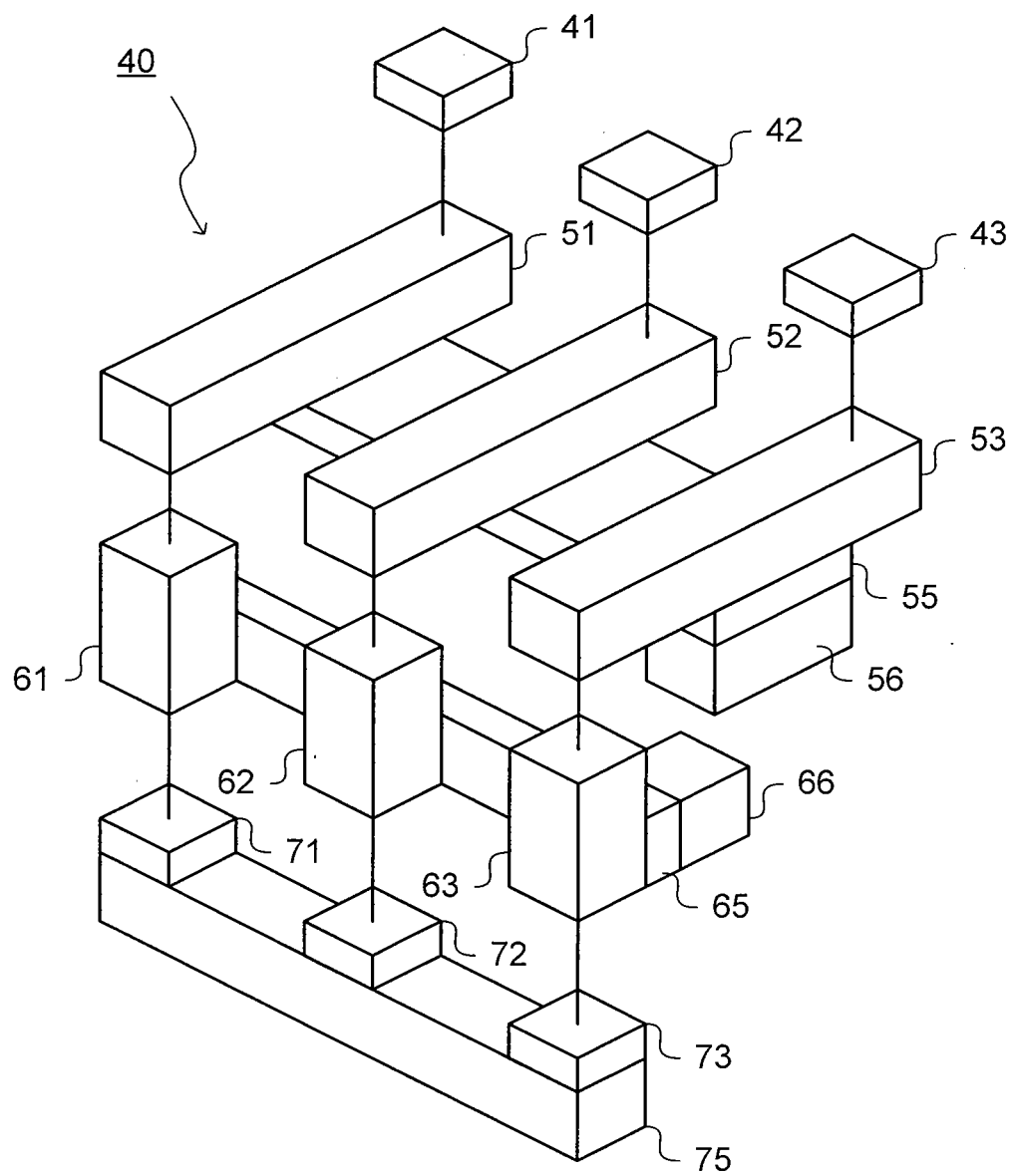
FIG. 6 depicts an arrangement of a calibration unit for a lithography apparatus having a plurality of arrays of individually controllable elements.

FIG. 6 depicts an exemplary calibration unit 40 that may be used to generate calibration data for a lithographic apparatus having a plurality of arrays of individually controllable elements 41, 42, and 43. Although FIG. 6 depicts a calibration unit 40 for a lithography apparatus having three arrays of individually controllable elements, the arrangement of FIG. 6 may be modified as required for use with any number of arrays of individually controllable elements. In an additional embodiment, the lithographic apparatus may incorporate fourteen (14) arrays of individually controllable elements, such as arrays 41, 42, and 43 depicted in FIG. 6.

Calibration unit 40, as depicted in FIG. 6, may include components for each of the arrays of individually controllable elements 41, 42, and 43 that are similar to those described above with reference to FIG. 5. For example, selection optics 51, 52, and 53 may be provided to select, respectively, a portion of the modulated beam of radiation from each section of the modulated beam of radiation modulated by a corresponding one of the arrays of individually controllable elements 41, 42, and 43. Further, a set of optics 61, 62, and 63 may associated, respectively with the selection optics 51, 52, and 53 to direct the corresponding portion of the modulated beam of radiation onto a corresponding one of radiation beam inspection devices 71, 72, and 73. Accordingly, it will be appreciated that, in the arrangement depicted in FIG. 6, each of the arrays of individually controllable elements 41, 42, and 43 is associated with a respective projection unit and with a respective one of radiation beam inspection devices 71, 72, and 73. Therefore, the calibration unit 40 may simultaneously generate and/or update calibration data for each of the arrays of individually controllable elements 41, 42, and 43 of the lithography apparatus. Accordingly, the time taken to perform a calibration process for the entire lithography apparatus is significantly less than if each array of individually controllable elements were inspected separately.

In additional embodiments, variations of calibration unit 10, described above with reference to FIG. 5, may also apply in a corresponding fashion to calibration unit 40 depicted in FIG. 6.

As depicted in FIG. 6, the one or more optical elements of the selection set of optics 51, 52, and 53, which select the portion of the corresponding section of the modulated beam of radiation to be inspected by each of the radiation beam inspection devices 71, 72, and 73, may be mounted to a common reference frame 55. A single actuator system 56 may therefore be provided to control the position of the common reference frame 55, thereby controlling the position of the optical elements used to select the portions of the modulated beam of radiation to be inspected by each of the radiation inspection devices 71, 72, and 73. Accordingly, in one embodiment, a single actuator system may control the selection of the portions of the modulated beam of radiation that are inspected by each of the radiation beam inspection devices 71, 72, and 73.

Similarly, each of the radiation beam inspection devices 71, 72, and 73 may be mounted, respectively, to a common reference frame 75 such that the relative position of each of the radiation beam inspection devices 71, 72, and 73 is substantially fixed. In a corresponding manner to that described above with reference to the calibration unit 10 of FIG. 5, the projection system PS may also be mounted to the common reference frame 75, to which the radiation beam inspection devices 71, 72, and 73 are likewise mounted.

One or more of the optical elements within the optical element sets 61, 62, and 63, which are provided to direct the portion of the modulated beam of radiation onto respective radiation beam inspection devices 71, 72, and 73, may also be mounted to the common reference frame 75 onto which the radiation beam inspection devices 71, 72, and 73 are mounted. However, in the embodiment of FIG. 6, at least one optical element within the optical element sets 61, 62, and 63 may be mounted to an optical element reference frame 65 such that the relative positions of those optical elements are fixed. An actuator system 66 may be provided to adjust the position of the optical element reference frame 65 relative to the position of the common reference frame 75 to which the radiation beam inspection devices 71, 72, and 73 are mounted. Accordingly, the actuator 66 may be used to simultaneously adjust the relative position of at least one optical element within each optical element set 61, 62, and 63 relative to the position of radiation beam inspection devices 71, 72, and 73. Accordingly, the focus of the image of the modulated beam of radiation directed onto each of the radiation beam inspections devices 71, 72, and 73 may be simultaneously adjusted using a single actuator system 66.

It will be appreciated that a calibration unit, such as calibration unit 40 depicted in FIG. 6, may incorporate position sensors to monitor the relative position of any two of the reference frames 55, 65, and 75 relative to the projection system PS and/or to monitor the position of any of the reference frames 55, 65, and 75 relative to another reference frame provided within the lithographic apparatus.

In a manner corresponding to that described above with reference to FIG. 5, it will be appreciated that the selection optics 51, 52, and 53 of the calibration unit 40 depicted in FIG. 6 may be configured such that, in a first state, no part of the corresponding projection unit prevents part of the modulated beam of radiation from passing into the projection system PS and, in a second state, the selection optics 51, 52, and 53 select for inspection a respective portion of a section of the modulated beam of radiation modulated by one of the array of individually controllable elements 41, 42, and 43. In one embodiment, the actuator system 56 may be configured to move the reference frame 55 such that the components of the selection optics 51, 52, and 53 are withdrawn from the beam of radiation modulated by the arrays of individually controllable elements 41, 42, and 43.

Figure 7:
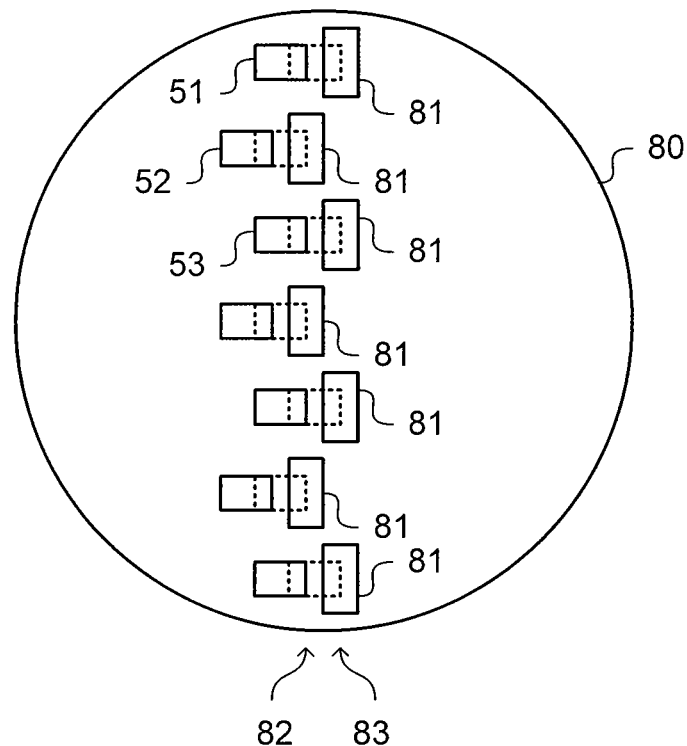
FIG. 7 depicts an arrangement of portions of a calibration unit in an image field having a plurality of portions corresponding to sections of a modulated beam of radiation, modulated by respective arrays of individually controllable elements.

FIG. 7 depicts, in cross-section, an exemplary image field projected onto the substrate by the projection system PS. As depicted in FIG. 7, portions 81 of the image field 80, which correspond to sections of the beam of radiation modulated by each of the arrays of individually controllable elements, form a relatively small part of the image field 80. In addition, the portions 81 of the image field 80 may be arranged in columns 82 and 83 that are offset from one another. In the embodiment of FIG. 7, adjacent portions of the image field are set apart from each other by a small distance along the length of the columns 82 and 83. In FIG. 7, such an arrangement is required in order to provide sufficient space around each of the arrays of individually controllable elements to accommodate connections for the control signals and, for example, cooling. However, in additional embodiments, there may be no such separation, and such an arrangement corresponds to the placement of the arrays of individually controllable elements by themselves (for example, those individually-controllable elements depicted in FIG. 6).

As shown in FIG. 7, selection optics 51, 52, and 53 may be configured such that they need only move a relatively small distance in order to switch between the first state (shown in solid lines in FIG. 7) and the second state (shown in dashed lines in FIG. 7), in which portions of the modulated beam of radiation are inspected.

FIG. 8 schematically depicts an exemplary set of optics that may be used to inspect a portion of a modulated beam of radiation using a calibration unit, such as the calibration units described above with reference to FIGS. 5 and 6. It will be appreciated that the optical elements depicted in FIG. 8 are simplified and that at least some of the optical components may be provided by at least a part of the projection units discussed above with reference to FIGS. 5 and 6.

As depicted in FIG. 8, radiation is provided by a radiation source SO and directed onto the array of individually controllable elements PD by the illumination system IL. Radiation from a portion of the modulated beam of radiation is then directed onto the radiation beam inspection device 90 by means of the projection unit, schematically represented in FIG. 8 by optical elements 91 and 92. As shown in FIG. 8, the radiation beam inspection device 90 may be positioned at an image plane of the optical elements 91 and 92 such that an aerial image of the array of individually controllable elements PD is imaged onto the radiation beam inspection device 90. However, by adjusting the distance of at least one of the optical elements 91 and 92 relative to the radiation beam inspection device 90, focus measurements may be obtained. In various embodiments, such adjustments may be made by means of an actuator system, or in the case of a calibration unit, such as calibration unit 40 as depicted in FIG. 6, by moving a reference frame to which the optical element is mounted. Beneficially, therefore, by inspecting the portion of the modulated beam of radiation with the at least one optical element in different positions, it is possible to obtain information regarding the phase behavior of the individually controllable elements of the array of individually controllable elements, providing additional calibration data.

As depicted in FIG. 8, one or more shutters 93 may be controlled by associated actuators 94 and may be positioned in order to remove unwanted stray radiation. In various embodiments, the one or more shutters 93 may be positioned a pupil plane 95 within the projection unit and/or between the projection unit and the radiation beam inspection device 90.

FIG. 9 schematically depicts a set of optics that may be incorporated into a calibration unit to inspect of a portion of a modulated beam of radiation. The set of optics depicted in FIG. 9 is similar to that depicted in to FIG. 8 and, for brevity, the description of like components will not be repeated. However, in this arrangement, the projection unit is configured such that the radiation beam inspection device 90 is arranged at a pupil plane of the projection unit. In one embodiment, such an arrangement may be achieved by adjusting the relative position of one or more of the optical elements of the projection unit and/or by adding, and/or removing, one or more of the optical elements of the projection unit from the radiation beam path.

As described above, if the projection unit is part of a calibration unit 40 having a plurality of projection units, the moveable optical elements of the projection unit may be mounted to a reference frame to which corresponding optical elements of other projection units are also mounted. Therefore, a single-actuator system may be provided to control the corresponding optical elements of each of the projection units.

It will be appreciated that a single projection unit may be configured to inspect the image field in the manner depicted in FIG. 8. In an additional embodiment, the single projection system may be configured to inspect pupil images in the manner depicted in FIG. 9, or alternatively, may be configured to be switchable between either configuration.

The use of pupil measurements, as depicted in FIG. 9, may provide an opportunity to obtain more accurate calibration data relating to the response of individually controllable elements to an associated control signal. For example, in the case of arrays of individually controllable elements in which the individually controllable elements are formed from rotatable mirrors, changing an angle of rotation of one of the mirrors by changing the control signal applied to that element results in a movement of the image on the radiation beam inspection device 90. Accordingly, detecting the position of the image formed on the radiation beam inspection device 90 provides an accurate measurement of the response of the individually element to the control signal.

However, obtaining calibration data for each individually controllable element in the manner discussed above may be relatively slow. Accordingly, a combination of image field measurements, in which the projection unit is configured as schematically depicted in FIG. 8, and pupil measurements, in which the projection unit is configured as schematically represented in FIG. 9, may be used in an additional embodiment In order to complete a calibration process more quickly using pupil measurements, the projection unit may include a cylindrical lens that forms a pupil image of the portion of the modulated beam of radiation on a line on the radiation beam inspection device. Such an arrangement is schematically depicted in FIG. 10. The arrangement schematically depicted in FIG. 10 is similar to that depicted in FIGS. 8 and 9, and as such, description of the corresponding portions will not be repeated. As depicted in FIG. 10, a cylindrical lens 100 (shown in cross-section in FIG. 10) may be used to project the portion of the modulated beam of radiation onto a line 101 (shown end-on in FIG. 10) of the radiation beam inspection device 90. Accordingly, pupil measurements may be performed simultaneously for a row of individually controllable elements in the array PD. Changes in the angle of rotation of each of the mirrors correspond to a movement of part of the line image projected onto the radiation beam inspection device, in a direction substantially perpendicular to line 101.

A variety of calibration processes may be performed using calibration units described above, and these calibration processes are described below in relation to the generation and/or updating of calibration data for a single array of individually controllable element controlled by a single array controller using a single radiation beam inspection device. However, in additional embodiments, these calibration processes may also be used for calibration units having a plurality of radiation beam inspection devices for generating and/or updating calibration data for a lithographic apparatus having a plurality of arrays of individually controllable elements. Furthermore, it will be appreciated that a calibration controller may control the calibration processes and that, in the case of a calibration unit that generates and/or updates calibration data for a plurality of arrays of individually controllable elements, a single calibration controller may be provided. In alternate embodiments, a plurality of calibration controllers may be provided and arranged, for example, to generate and/or update calibration data for a respective array of individually controllable elements. Likewise, a single array controller may be provided for controlling all of the arrays of individually controllable elements of the lithography apparatus. Alternatively, a plurality of array controllers may be provided to control, for example, a respective array of a plurality of arrays of individually controllable elements.

In one exemplary calibration process, an array controller sets each of the individually controllable elements such that the modulated beam of radiation is nominally at minimum radiation intensity across its cross-section. For example, if a previous calibration process has been performed, the array controller may set the individually controllable elements using previously-generated calibration data. Alternatively, for example, if calibration data has not previously been generated, the array controller may provide control signals to each of the individually controllable elements based on an assumption that the array of individually controllable elements behaves precisely in line with design specification.

Subsequently, a radiation inspection device inspects one or more portions of the modulated beam of radiation. In one embodiment, the radiation inspection device inspects a portion of the modulated beam of radiation considered representative of the entire modulated beam of radiation. Alternatively, for example, substantially the entire modulated beam of radiation may be inspected. Based on the deviation of the measured intensity from the minimum radiation intensity, calibration data may be generated or revised, and the array controller may use the new calibration data to re-set the array of individually controllable elements to modulate the beam of radiation to have minimum radiation intensity across its cross-section. These steps may be repeated iteratively to improve the calibration data until the measured radiation intensity is considered to be sufficiently close to the minimum radiation intensity across the cross-section of the inspected portions of the modulated radiation beam. In one embodiment, the above-described process may provide useful set-point calibration data.

Once the individually controllable elements have been set to the necessary states such that the intensity of the modulated beam of radiation cross its cross-section is substantially at a minimum, each individually controllable element may, in turn, be provided with successive control signals at different levels in order to measure the response of the individually controllable element to different control signal levels.

In one embodiment, the radiation beam inspection device may measure a change in the aerial image caused by the application of different control signals to each individually controllable elements. Accordingly, once each individually controllable element has been tested in this manner, it is possible to determine the total radiation intensity that will be provided at each point within the aerial image when a particular set of control signals is provided to the array of individually controllable elements. In one embodiment, the total radiation intensity provided at each point within the aerial image may be determined by summing the contributions at that point for each of the individually controllable elements being provided with the corresponding control signal. Likewise, in reverse, one may determine the control signals that must be provided to each element within the array of individually controllable elements in order to provide a desired pattern of radiation intensity in the aerial image.

It will be appreciated that each individually controllable element may only contribute radiation intensity across a relatively small part of the aerial image of the modulated beam of radiation. Accordingly, in one embodiment, sequences of control signals are simultaneously provided to multiple individually controllable elements in order to test their response to different control signals without any of the pixels of the radiation beam inspection device receiving radiation from more than one individually controllable element simultaneously. Accordingly, the generation and/or updating of the calibration data used to generate the control signals for the array of individually controllable elements can be performed faster than if each individually controllable element needed to be tested entirely separately.

In an additional embodiment of a calibration process, a plurality of predetermined patterns of control signals are successively provided to the array of individually controllable elements and the resultant aerial image is inspected by the radiation beam inspection device. By inspecting a sufficient number of aerial images resulting from different patterns of control signals applied to the array of individually controllable elements, it is possible to determine the impact on the aerial image of the response of each of the individually controllable elements. For example, the calibration controller may include a processing unit $30a$ that models the response of the individually controllable elements to the control signals. By inspecting the plurality of aerial images resulting from the different predetermined patterns of control signals, the parameters of the model may be updated, thereby generating and/or updating the calibration data. In such an embodiment, the parameters of the modeling process may be revised such that the correspondence between the expected radiation intensity levels determined using the modeling process and the measured radiation intensity levels more closely correspond.

In a further embodiment, the predetermined patterns of control signals applied to the array of individually controllable elements may be selected in order to maximize the signal to noise behavior, for example, when attempting to improve the modeling of specific mirror parameters. Alternatively or additionally, the predetermined patterns of control signals provided to the array of individually controllable elements may be random or pseudo-random, which may be beneficial if the behavior of the array of individually controllable elements is not known. Further, the predetermined patterns of control signals provided to the arrays of individually controllable elements may be based upon data obtained from previous calibration processes.

The calibration units and processes discussed above have been described in terms generating and/or updating calibration data. However, in additional embodiments, these calibration units and processes may also be used in order to validate previously obtained calibration data. For example, the calibration controller may determine the expected results from the radiation beam inspection device for a given set of control signals provided to an array of individually controllable elements using pre-existing calibration data. These may then be compared to actual measurements made by the radiation beam inspection device. If the deviation between the expected measurements and the actual measurement is below a given threshold, the calibration data is considered valid. However, if the deviation is beyond a given threshold, the calibration data may be deemed invalid.

Such an arrangement may be particularly beneficial because, even using the calibration units and calibration processes discussed above, a full calibration process that generates and/or updates calibration data may take a relatively long time. In any case, the time taken during a calibration process represents time not spent exposing patterns on a substrate, and therefore, represents a cost. Furthermore, it may be unknown for how long calibration data can be expected to be valid. Accordingly, if no steps are taken to periodically validate the calibration data, a lithography apparatus may have to perform a full calibration process unnecessarily frequently, resulting in unnecessary costs, or may continue to expose substrates after the calibration data has ceased to be valid, resulting in substandard exposure of patterns on the substrates. Therefore, a calibration data validation process such as that described above, which may be significantly faster than a full calibration procedure, may be performed, for example, by testing a portion of the calibration data periodically in order to confirm whether or not the calibration data remains valid.

It will be appreciated that each time a calibration data validation process is performed, a different part of the calibration data may be validated (e.g., data corresponding to a different part of an array of individually controllable elements). Accordingly, over a given number of calibration data validation processes, all of the calibration data may be successively validated.

In an embodiment, a calibration data validation process may be initiated periodically, including, but not limited to, once every day. Alternatively or additionally, a calibration data validation process may be initiated whenever a specific event occurs. For example, the calibration data validation process may be initiated whenever the operation of a lithography apparatus is suspended for a reason that does not interfere with the performance of the calibration data validation process, including, but not limited to, if a fault occurs in a substrate handler. In another embodiment, a calibration data validation process may be initiated by an instruction from an operator or a control system that controls a plurality of apparatus including the lithographic apparatus. In yet another embodiment, a calibration data validation process may be initiated by a monitoring system configured to monitor the quality of patterns being formed on a substrate exposed by the lithography apparatus. For example, the monitoring system may initiate the calibration data validation process in response to deterioration in the quality of the patterns exposed on the substrate.

In an additional embodiment of a calibration data validation process, a calibration controller may determine the expected image using pre-existing calibration data while the lithography apparatus continues to expose patterns on substrates using that calibration data. Accordingly, as soon as the test pattern of control signals is provided to the array of individually controllable elements and the portion of the modulated beam of radiation is inspected by the radiation beam inspection device, a comparison may be made between the expected pattern and the measured pattern, thereby allowing for a rapid determination of whether or not the calibration data remains valid. Accordingly, if the calibration data does remain valid, the lithographic apparatus may quickly resume exposure of substrates. If the calibration data validation process determines that the calibration data is not valid, a full calibration process for generating and/or updating calibration data may be initiated.

It should be appreciated that the calibration data validation process may be arranged such that if the difference between the expected and measured pattern is greater than an acceptable pattern threshold level but less than a second threshold level, the lithographic apparatus may resume the exposure process using the calibration data but that a full calibration process for generating and/or updating calibration data may be scheduled for a subsequent time. Accordingly, one or more calibration data validation processes may be used to monitor the drift of the lithographic apparatus and schedule a calibration process accordingly.

It should be appreciated that the generation and/or updating of calibration data based on the measurements of the radiation beam inspection device may require very large amounts of calculation. Accordingly, the lithography apparatus may be configured to perform the steps of a calibration process that involve the inspection of portions of the modulated beam of radiation and subsequently to continue the exposure process using the previous calibration data while the new calibration data is determined from the inspection data.

Once the new calibration data is determined, the exposure process may continue using the new calibration data. Accordingly, the time in which the lithography apparatus is suspended from exposing patterns on substrates is minimized, reducing costs. However, it will be appreciated, that in such an arrangement, if calibration processes are scheduled, such schedules should take account of the delay between the completion of the radiation beam inspection processes and the completion of the determining of the new calibration data.

Although specific reference can be made in this text to the use of lithographic apparatus in the manufacture of a specific device (e.g., an integrated circuit or a flat panel display), it should be understood that the lithographic apparatus described herein can have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), light emitting diodes (LEDs), etc. Also, for instance in a flat panel display, the present apparatus can be used to assist in the creation of a variety of layers, e.g., a thin film transistor layer and/or a color filter layer.

Although specific reference is made above to the use of embodiments of the invention in the context of optical lithography, it will be appreciated that the invention can be used in other applications, for example imprint lithography, where the context allows, and is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A lithographic apparatus comprising:
    a device configured to produce a modulated beam of radiation based on control signals;
    an array controller configured to provide the control signals to the device;
    a projection system configured to project the modulated beam of radiation onto a substrate;
    a calibration unit, disposed between the device and the projection system, and configured to at least one of generate calibration data and update calibration data; and a calibration controller configured to instruct the array controller to provide the control signals based on the calibration data;

wherein the calibration unit is further configured to switch between at least a first state and a second state, such that, in the first state, the modulated beam of radiation is directed towards the projection system without interaction with the calibration unit and, in the second state, at least a portion of the modulated beam of radiation is directed towards the calibration unit, and wherein the calibration unit comprises a radiation beam inspection device configured to inspect the portion of the modulated beam of radiation received by the calibration unit.

2. The lithographic apparatus of claim 1, further comprising a plurality of arrays of individually controllable elements, wherein each of the plurality of arrays is configured, respectively, to modulate a section of the beam of radiation, wherein the calibration unit comprises a plurality of radiation beam inspection devices, and wherein each of the plurality of radiation beam inspection devices is configured, respectively, to inspect a portion of the section of the beam of radiation passed into the calibration unit and modulated by a corresponding one of the plurality of arrays of individually controllable elements.

3. The lithographic apparatus of claim 2, wherein the calibration unit further comprises:

a plurality of projection units, each of the plurality of projection units configured, respectively, to project a portion of the section of the modulated beam of radiation onto a corresponding one of the plurality of radiation beam inspection devices;

a projection unit frame onto which each of the plurality of projection units are mounted such that a relative position of each projection unit is fixed; and a projection unit actuator system configured to control a position of the projection unit frame relative to the modulated beam of radiation in order to control the portion of the section of the beam of radiation projected onto each of the plurality of radiation beam inspection devices.

4. The lithographic apparatus of claim 3, wherein the projection unit actuator system is configured to move the projection unit frame between a first position and a second position, wherein the first and second positions correspond, respectively, to the first and second states of the calibration unit;

wherein, in the second position, each of the plurality of projection units is configured, respectively, to project the portion of the section of the modulated beam of radiation onto the corresponding one of the plurality of radiation beam inspection devices; and wherein, in the first position, each of the plurality of projection units is located such that the modulated beam of radiation modulated by the corresponding one of the plurality of arrays of individually controllable elements is unobstructed by each of the plurality of projection units.

5. The lithographic apparatus of claim 3, further comprising:

an inspection device frame onto which each of the plurality of radiation beam inspection devices are mounted such that a relative position of each of the plurality of radiation beam inspection devices is substantially fixed, and wherein the inspection device frame is mounted to the lithography apparatus such that a position of the inspection frame device relative to the projection system is substantially fixed.

6. The lithographic apparatus of claim 3, wherein each of the plurality of projection units respectively comprise an optical element set having at least one optical element configured to project the portion of the section of the modulated beam of radiation onto the corresponding one of the plurality of radiation beam inspection devices, wherein a position of each of the optical element sets relative to the respective radiation beam inspection device is controlled in a direction parallel to a direction of propagation of the modulated beam of radiation projected onto the corresponding ones of the plurality of radiation beam inspection devices; and wherein the calibration unit further comprises:

an optical element frame to which each of the optical element sets are mounted such that their relative positions are fixed; and an optical element actuator system configured to control a position of the optical element frame relative to the plurality of radiation beam inspection devices in a direction parallel to the direction of propagation of the radiation projected onto the plurality of radiation beam inspection devices.

7. The lithographic apparatus of claim 1, wherein the calibration unit is configured to control the portion of the modulated beam of radiation that is inspected by the radiation beam inspection device.

8. The lithographic apparatus according to claim 7, wherein the calibration unit comprises a projection unit configured to project the portion of the modulated beam of radiation onto the radiation beam inspection device.

9. The lithographic apparatus according to claim 8, wherein movement of the projection unit relative to the modulated beam of radiation controls the portion of the modulated beam of radiation inspected by the radiation beam inspection device.

10. The lithographic apparatus of claim 9, wherein the position of the optical element set relative to the radiation beam inspection device is set such that the radiation beam inspection device inspects a pupil plane of the portion of the modulated beam of radiation.

11. The lithographic apparatus of claim 8, wherein the projection unit comprises an optical element set having at least one optical element configured to project the portion of the modulated beam of radiation onto the radiation beam inspection device, and wherein a position of the optical element set relative to the radiation beam inspection device is controlled in a direction parallel to a direction of propagation of the modulated beam of radiation projected onto the radiation beam inspection device.

12. The lithographic apparatus of claim 11, wherein the position of the optical element set relative to the radiation beam inspection device is set such that the radiation beam inspection device inspects an image plane of the portion of the modulated beam of radiation.

13. The lithographic apparatus of claim 12, wherein the optical element set is moved to at least one further position in which an image inspected by the radiation beam inspection device is defocused relative to an inspection of the image at the image plane.

14. The lithographic apparatus of claim 12, further comprising at least one moveable shutter configured to be moveable to a given position in order to prevent a part of the modulated beam of radiation from being projected onto the radiation beam inspection device.

15. The lithographic apparatus of claim 8, wherein the projection unit comprises a cylindrical lens and an actuator system, the actuator system being configured to move the cylindrical lens between at least a first position, in which the cylindrical lens is located outside of an optical path of radiation projected onto the radiation beam inspection device, and a second position, in which the cylindrical lens substantially focuses the portion of the modulated beam of radiation onto a line on the radiation beam inspection device.

16. The lithographic apparatus of claim 1, further comprising an illumination system configured to condition the beam of radiation.

17. The lithographic apparatus of claim 16, wherein the illumination system is configured to be operable in at least two settings that respectively condition the beam of radiation in a different manner; and
wherein the calibration unit comprises the calibration controller, the calibration controller further configured to operate the calibration unit to perform separate inspections of the modulated beam of radiation for each setting of the illumination system and to at least one of generate and update respective calibration data for each setting of the illumination system.

18. The lithographic apparatus of claim 17, wherein, in a first setting of the illumination system, the beam of radiation modulated by the device is linearly polarized with an orientation parallel to a first direction, and
wherein, in a second setting of the illumination system, the beam of radiation modulated by the device is linearly polarized with an orientation perpendicular to the first direction.

19. The lithographic apparatus of claim 1, wherein the device is an array of individually controllable elements.

20. The lithographic apparatus of claim 19, wherein:
the control signals control elements of the array of individually controllable elements; and
the array controller is further configured to generate the control signals and to provide the generated control signals to the elements of the array of individually controllable elements in response to desired pattern data.

21. The lithographic apparatus of claim 20, wherein the calibration unit comprises the calibration controller, the calibration controller further configured to:
instruct the array controller to set each element of the array of individually controllable elements such that the modulated beam of radiation is nominally at minimum radiation intensity across its cross-section;
operate the calibration unit to inspect at least the portion of the modulated beam of radiation;
at least one of generate the calibration data and update the calibration data, based on the inspected portion of the modulated beam of radiation, to be used by the array controller when generating the control signals for controlling the array of individually controllable elements;
instruct the array controller to re-set the array of individually controllable elements to modulate the beam of radiation to have minimum radiation intensity across its cross-section based on the generated control signals; and
repeat the operating, at least one of generating and updating, and instructing the array controller to re-set the array of individually controllable elements until the calibration controller determines that the variation of the radiation intensity from a given minimum value across the cross-section of the modulated beam of radiation is below a predetermined threshold.

22. The lithographic apparatus of claim 21, wherein the calibration controller is further configured to:
instruct the array controller to provide a different control signal to an element in the array of individually controllable elements; and
at least one of generate the calibration data and update the calibration data associated with the element based on a change in the portion of the modulated beam of radiation inspected by the radiation beam inspection device.

23. The lithographic apparatus of claim 22, wherein the calibration controller is configured to instruct the array controller to provide a sequence of different control signals to the element, and
wherein the calibration controller at least one of generates the calibration data and updates the calibration data associated with the element based on changes in the portion of the beam of radiation modulated in response to the sequence of different control signals and inspected by the radiation beam inspection device.

24. The lithographic apparatus according of claim 22, wherein the calibration controller is configured to instruct the array controller to simultaneously provide different control signals to a plurality of elements in the array of individually controllable elements and to at least one of generate the calibration data and update the calibration data associated with each of the plurality of elements based on corresponding changes in the portion of the modulated beam of radiation inspected by the radiation beam inspection device, and
wherein the elements of the plurality of elements are positioned apart from each other such that a part of the portion of the modulated beam of radiation that changes as a result of one of the different control signals applied to one element of the plurality of elements is separate from all of the parts of the portion of the modulated beam of radiation that change as a result of different ones of the different control signals applied to each of the other elements of the plurality of elements.

25. The lithographic apparatus of claim 21, wherein the calibration controller is configured to instruct the array controller to set each element of the array of individually controllable elements using calibration data obtained in a preceding calibration operation.

26. The lithographic apparatus of claim 19, wherein:
the projection system comprises a combination of optical elements through which radiation is directed from the array of individually controllable elements to the radiation beam inspection device, and
a numerical aperture of the combination of optical elements is below a value allowing for the radiation beam inspection device to resolve an individually controllable element in the array using radiation of a wavelength of the beam of radiation.

27. The lithographic apparatus of claim 20, wherein the calibration unit comprises a processing unit that uses a modeling process to model a response of elements of the array of individually controllable elements to the control signals,
wherein the calibration unit is configured to instruct the array controller to provide a predetermined sequence of control signals to each element in the array of individually controllable elements, and
wherein the calibration unit is configured to revise parameters of the modeling process in order to improve correspondence between radiation intensity level measurements made by the radiation beam inspection device and corresponding radiation intensity levels determined using the modeling process.

28. The lithographic apparatus of claim 20, wherein the calibration unit changes from the second state to the first state once the radiation beam inspection device collects sufficient data from the inspection of the portion of the beam of radiation passing into the calibration unit, wherein the calibration unit uses the data collected from the radiation beam inspecting device to at least one of generate the calibration data and update the calibration data in order to provide new calibration data, and wherein the lithographic apparatus is configured such that, prior to the calibration unit providing the new calibration data, the array of individually controllable elements modulates the beam of radiation in response to control signals based on previously-generated calibration data.

29. The lithographic apparatus of claim 20, wherein the calibration unit comprises the calibration controller, the calibration controller further configured to:

determine, in response to at least one predetermined stimulus while the calibration unit is in the first state and while the lithographic apparatus exposes patterns on the substrate, an expected result from an inspection of at least the portion of the modulated beam of radiation in response to a given set of control signals;

suspend exposure of the patterns on the substrate after determining the expected result and change the calibration unit to the second state, instruct the array controller to provide the given set of control signals to the array of individually controllable elements;

inspect the portion of the modulated beam of radiation using the radiation beam inspection device; and validate the calibration data by determining if a result of the inspection by the radiation beam inspection device differs from the expected result by a predetermined amount.

30. The lithographic apparatus of claim 29, wherein the calibration unit changes to the first state and resumes exposure of the patterns on the substrate if the calibration data is valid, and wherein the calibration unit initiates a calibration process in order to at least one of generate the calibration data and update the calibration data if the calibration data is invalid.

31. The lithographic apparatus of claim 29, wherein the predetermined stimulus comprises at least one of a lapse of a predetermined period of time, an instruction from an operator, an instruction from a control system that controls a plurality of apparatus including the lithographic apparatus, and an instruction from a monitoring system configured to monitor patterns being formed on substrates exposed by the lithographic apparatus.

32. A method of calibrating an array of individually controllable elements in a lithographic apparatus, comprising:

providing control signals to each element in the array of individually controllable elements to configure each element such that a modulated beam of radiation is nominally at minimum radiation intensity across its cross-section;

modulating the beam of radiation using the array of individually controllable elements configured according to the provided control signals;

inspecting at least a portion of the modulated beam of radiation using a calibration unit configured to switch between at least a first state and a second state, such that, in the first state, the modulated beam of radiation is directed towards a projection system without interaction with the calibration unit and, in the second state, at least a portion of the modulated beam of radiation is directed towards the calibration unit;

at least one of generating and updating calibration data using the results of the modulating to generate the control signals for the array of individually controllable elements;

reconfiguring the array of individually controllable elements based on the generated control signals to modulate the beam of radiation to have a minimum radiation intensity across its cross-section; and repeating the modulating, inspecting, and at least one of generating and updating until a variation of the radiation intensity from a given minimum value across the cross-section of the beam of radiation is below a predetermined threshold.

33. The method of claim 32, further comprising providing a different control signal to an element in the array of individually controllable elements; and at least one of generating the calibration data and updating the calibration data associated with the element based on a change in the inspected portion of the modulated beam of radiation.

34. The method of claim 33, wherein:

the providing a different control signal comprises providing a sequence of different control signals to the element, and the at least one of generating and updating comprises at least one of generating the calibration data and updating the calibration data associated with the element based on changes in the inspected portion of the beam of radiation modulated in response to the sequence of control signals.

35. The method of claim 33, wherein:

the providing the different control signal comprises simultaneously providing different control signals to a plurality of individually controllable elements in the array, the at least one of generating and updating comprises at least one of generating the calibration data and updating the calibration data associated with each element of the plurality of individually controllable elements based on corresponding changes in the inspected portion of the modulated beam of radiation, and elements of the plurality of individually controllable elements are positioned apart from each other such that a part of the portion of the modulated beam of radiation that changes as a result of one of the different control signal applied to one element of the plurality of individually controllable elements is separate from all of the parts of the portion of the modulated beam of radiation that change as a result of different ones of the different control signals applied to each of the other elements of the plurality of individually controllable elements.

36. The method of claim 32, wherein the providing comprises configuring each of the individually controllable elements of the array using control signals generated from the calibration data obtained in a preceding calibration operation.

37. The method of claim 32, further comprising:

modeling a response of elements of the array of individually controllable elements to the control signals; and providing a predetermined sequence of control signals to each of the elements of the array of individually controllable elements, wherein at least one of generating and updating comprises revising parameters of the modeling in order to improve correspondence between radiation intensity level measurements made by the radiation beam inspection device and corresponding radiation intensity levels determined using the nodeling.

38. The method of claim 32, wherein at least one of generating and updating comprises at least one of generating the calibration data and updating the calibration data based on data collected in the inspecting in order to provide new calibration data; and wherein prior to providing the new calibration data in at least one of generating and updating, the modulating comprises modulating the beam of radiation using the array of individually controllable elements configured in response to control signals based on the calibration data from a previous calibration process.

39. The method of claim 32, further comprising:
projecting the modulated beam of radiation onto a substrate to expose one or more patterns on the substrate.

40. The method of claim 39, further comprising:
determining, in response to at least one predetermined stimulus, an expected result of a re-inspection of at least a portion of the modulated beam of radiation in response to a given set of control signals generated from the calibration data;
suspending the exposure of one or more patterns on the substrate after determining the expected result;
providing the given set of control signals to the array of individually controllable elements;
modulating the beam of radiation using the array of individually controllable elements configured in accordance with the given set of control signals;
re-inspecting the portion of the modulated beam of radiation; and
validating the calibration data by determining if a result of the re-inspecting differs from the expected result of the determining by a predetermined amount.

41. The method of claim 40, further comprising:
resuming the exposure of the one or more patterns on the substrate if the calibration data is valid; and
initiating a calibration process in order to at least one of generate the calibration data and update the calibration data if the calibration data is invalid.

42. The method of claim 40, wherein the at least one predetermined stimulus comprises at least one of a lapse of a predetermined period of time, an instruction from an operator, an instruction from a control system that controls a plurality of apparatus including the lithography apparatus, and an instruction from a monitoring system configured to monitor patterns being formed on substrates exposed by the lithography apparatus.

43. A device manufacturing method, comprising:
providing control signals to each individually controllable element in an array of individually controllable elements to configure the elements such that a modulated beam of radiation is nominally at minimum radiation intensity across its cross-section;
modulating a beam of radiation using the configured array of individually controllable elements;
inspecting at least a portion of the modulated beam of radiation using a calibration unit configured to switch between at least a first state and a second state, such that, in the first state, the modulated beam of radiation is directed towards a projection system without interaction with the calibration unit and, in the second state, at least a portion of the modulated beam of radiation is directed towards the calibration unit;
at least one of generating and updating calibration data using the results of the modulating to generate the control signals for the array of individually controllable elements;
reconfiguring the array of individually controllable elements based on the generated control signals to modulate the beam of radiation to have a minimum radiation intensity across its cross-section;
repeating the modulating, inspecting, and at least one of generating and updating until a variation of the radiation intensity from a given minimum value across the cross-section of the beam of radiation is below a predetermined threshold; and
projecting the modulated beam of radiation onto a substrate.

44. A calibration unit in a lithographic apparatus, comprising:
a calibration controller configured to at least one of generate calibration data and update calibration data, the calibration controller further configured to instruct an array controller to provide control signals to a modulation device based on the calibration data, wherein the modulation device is configured to, modulate a beam of radiation;
a projection unit configured to switch between at least a first state and a second state, such that, in the first state, the modulated beam of radiation is directed towards a projection system of the lithographic apparatus without interaction with the calibration unit and, in a second state, the modulated beam of radiation is directed towards the calibration unit; and
a radiation beam inspection device configured to inspect at least a portion of the beam of radiation received by the calibration unit;
wherein the calibration unit is disposed between the modulation device and the projection system.

* * * * *

UNITED STATES PATENT AND TRADEMARK OFFICE
CERTIFICATE OF CORRECTION

PATENT NO. : 8,717,535 B2  
APPLICATION NO. : 12/341081  
DATED : May 6, 2014  
INVENTOR(S) : Visser et al.

Page 1 of 1

It is certified that error appears in the above-identified patent and that said Letters Patent is hereby corrected as shown below:

Title page, (75) Inventors section, after "Marcus Gerhardus Hendrikus Meijerink," please delete "The Hague" and insert --Den Haag--.

Title page, (75) Inventors section, after "Har Van Himbergen," please delete "The Hague" and insert --Den Haag--.

In the Claims:

In claim 44, column 32, line 36, after "configured to" please delete ",".

Signed and Sealed this  
Twenty-first Day of October, 2014

Michelle K. Lee  
*Deputy Director of the United States Patent and Trademark Office*